США005650938A

United States Patent [19]
Bootehsaz et al.

[11] Patent Number: 5,650,938
[45] Date of Patent: Jul. 22, 1997

[54] METHOD AND APPARATUS FOR VERIFYING ASYNCHRONOUS CIRCUITS USING STATIC TIMING ANALYSIS AND DYNAMIC FUNCTIONAL SIMULATION

[75] Inventors: Ahsan Bootehsaz, Santa Clara; Pierrick Pedron, Campbell; Franklin J. Malloy; Oz Levia, both of Sunnyvale, all of Calif.

[73] Assignee: Synopsys, Inc., Mountain View, Calif.

[21] Appl. No.: 571,757

[22] Filed: Dec. 13, 1995

[51] Int. Cl.[6] ............................................. G06F 17/50
[52] U.S. Cl. ..................... 364/490; 364/489; 364/490; 364/578
[58] Field of Search ............... 395/500; 364/488, 364/489, 578, 490

[56] References Cited

U.S. PATENT DOCUMENTS

| | | | |
|---|---|---|---|
| 5,095,454 | 3/1992 | Huang | 364/578 |
| 5,191,541 | 3/1993 | Landman et al. | 364/489 |
| 5,282,146 | 1/1994 | Aihara et al. | 364/489 |
| 5,541,849 | 7/1996 | Rostoker et al. | 364/489 |

*Primary Examiner*—Vincent N. Trans
*Assistant Examiner*—Vuthe Siek
*Attorney, Agent, or Firm*—Wagner, Murabito & Hao

[57] ABSTRACT

A method and apparatus for verifying an integrated circuit design composed of both synchronous and asynchronous regions. The computer implemented system imports a design combining synchronous and asynchronous regions and utilizes a static timing analyzer to automatically determine the boundaries of the asynchronous regions including input and output probe points at the inputs and outputs of the asynchronous regions. The static timing analyzer also generates a netlist of the asynchronous regions as well as certain information indicative of the signal arrival times of data sensed over the input probe points of the asynchronous regions. A functional simulator then uses test vectors generated for the primary inputs of the integrated circuit design and automatically determines a set of test vectors specifically for the asynchronous portion by monitoring the input probe points. This can be done for each asynchronous region. The functional simulator also automatically determines a set of expected output data from the generated test vectors by monitoring the output probe points. A full timing gate-level simulator then processes only the asynchronous regions using the generated test vectors, the asynchronous netlist, and the generated arrival times as input and generates an output which is verified against the expected output.

20 Claims, 10 Drawing Sheets

METHOD AND APPARATUS FOR VERIFYING ASYNCHRONOUS CIRCUITS USING STATIC TIMING ANALYSIS AND DYNAMIC FUNCTIONAL SIMULATION

BACKGROUND OF THE INVENTION (1) Field of the Invention

The present invention relates to the field of integrated circuit design. More specifically, the present invention relates to verification techniques of asynchronous designs.

(2) Background Technology

FIG. 1 represents a synthesis based high level flow diagram of a prior art process for design, capture and verification of an integrated circuit (IC) design. The present invention relates to methods and systems for design verification. An overall process is discussed below as background.

The process starts at block 10 where the IC design is specified and basic performance goals such as clock speed and signal throughput are defined. At block 12, high level block planning is performed where the IC design is partitioned into major functional units or blocks, each block can be allocated an area goal and also a delay or power consumption budget. At block 14, the design is captured by a designer into a hardware description language (HDL), such as Verilog or VHDL. This language description of the IC circuit is represented as block 16. At block 20, the HDL description 16 runs through a functional simulator to verify its functionality. If needed, modifications to the HDL are performed at block 18 such that the HDL description 16 meets its expected functionality.

At block 22, logic synthesis procedures take the HDL 16 and perform logic synthesis to translate the HDL into generic operators and then the generic operators are mapped into a technology dependent netlist having defined components (e.g., cells) and interconnections between them. Logic synthesis 22 procedures generate a gate-level representation of the IC design also called a mapped netlist. As a result of analysis to be described below, logic optimizations are performed to optimize the gate-level representation to certain performance and or design rule constraints and other design objectives.

At block 26 of FIG. 1, static timing analysis is performed which analyzes the timing characteristics of the mapped netlist to verify certain timing requirements. If timing violations exist or the design goals have not been achieved, timing constraints are re-adjusted and various synthesis directives and techniques are used to optimize the design accordingly. Modifications to the design can require generation of an amended HDL description 16 and another logic synthesis 22. At block 24, a gate-level simulation is performed to verify correct functionality after technology mapping and transformations are performed. Block 24 also checks for consistency with the behavior and register transfer level simulation. The gate-level simulation 24 ("full timing" simulation) can be unit delay based (where each cell is assumed to have a one unit delay associated therewith and a unit propagation delay between cells is assumed), or preferably can be a cycle based (where the cells are analyzed at the clock transitions) for best simulation performance. Full timing simulation 24 may be required for asynchronous parts of the design to verify timing correctness.

At block 28, the design is floorplanned, placed and routed, typically using the physical and timing constraints generated from previous states. At block 30, more accurate cell and net delays are calculated based on wire topology. These can be back-annotated into logic synthesis block 22, the static timing analysis block 26, and the gate-level simulator 24, for more realistic verification or optimization of the design.

At block 32 of FIG. 1, timing verifications are performed to verify that the final design satisfies the given or determined performance constraints (e.g., timing). Logic simulation 34 can also be performed to verify functional and timing aspects of the design. Block 36 monitors the output of blocks 32 and 34 to determine of the design satisfies the timing and functional requirements. If so, the prior art process of FIG. 1 reports the verification status.

FIG. 2 illustrates input and output signals to a full-timing event driven simulator ("logic simulator") 248 that operates on the gate-level to verify the timing and functionality of IC designs. In full-timing event driven simulation 248, the functionality and timing behavior of the design are verified by sensitizing the circuit using a set of test vectors that are applied to the design's primary inputs (usually coupled to an input pad). Simulation libraries 240 that are technology specific are input to the logic simulator 248. Test vectors 242 (patterns) are also input to the simulator 248 as well as a gate-level design description ("netlist") 244 that describes the design portion or block to be verified. A simulation control file 246 is input that sets up certain simulation parameters and design constraints and the logic simulator 248 generates a simulation report 250 in response to the above.

A major limitation to the above approach is that the quality of the timing verification process is very much dependent on the completeness of the test vectors, as only those paths sensitized by the test vectors are checked for timing violations by the simulator 248. Test vectors 242 designed for the design description 244 should be extensive and well conceived. Further, since the logic simulator 248 operates at the gate-level, performing both timing and functionality verification, it consumes a relatively large amount of processing time and therefore is impractical for verification of million-gate and larger designs.

FIG. 3 illustrates another method for verifying the timing of digital electronics circuits by use of a static timing analyzer 264. Process 264 examines the timing properties of every path in the design independent of its functionality. As a result, the analysis is exhaustive and complete. Process 264 inputs timing and logic libraries 260 that are technology dependent and also the design description 262 which describes the design region to be verified. A control file 266 is input and a verification report 268 is generated by the static timing analyzer 264. Aside from its exhaustiveness, the static timing analyzer 264 also offers much faster processing speed over the logic simulator 248. As a result, the static analyzer 264 is becoming more popular with the larger and more complex VLSI circuits for performing timing verification. This is causing a change in the way the timing and functionality of a design are verified.

FIG. 4A illustrates that for a fully synchronous design, static timing verification 276 can be used after synthesis 274, while a functional simulation 272 can be performed on the HDL 270 before synthesis 274 at the Register Transfer (RT) level. Static timing analysis 276 is best suited for synchronous designs where all signal events are measured with respect to a reference clock. Using the flow shown in FIG. 4A, the design described in the HDL 270 is verified for functionality by the functional simulation 272 and the static timing verification 276 is performed to verify the timing behavior of the design.

FIG. 4B illustrates the verification process used for an asynchronous design defined by HDL 280 that also contains synchronous regions. A functional simulation is performed 282 (ignores timing aspects) and then synthesis is performed at 284. For designs that are partly asynchronous, the timing correctness of the design can no longer be verified only through static timing analysis. For this kind of design 280, the entire circuit design or its asynchronous regions have to be timing simulated at the gate-level. For asynchronous designs, timing and functionality need to be verified simultaneously, as the circuit behavior on the functional level can be altered by the timing characteristics of the circuit.

Although effective in some applications, the approach of FIG. 4B has several drawbacks in certain circumstances. First, if the entire design needs to be timing simulated, then the major advantages (e.g., exhaustiveness and speed) of using a static timing analyzer 286 are lost. Secondly, if only selected portions of the IC design need to be analyzed, then the designer is faced with the challenge of identifying and isolating the asynchronous regions and creating the proper test vectors to apply to these regions. However, creating the test vectors is difficult because the regions may or may not correspond to a well defined module within the entire IC design and/or the asynchronous regions may or may not have well defined functionality. In the face of these challenges, the designer is required to generate test vectors to exercise each asynchronous region with a reasonable degree of completeness.

What is needed is a system and method that can readily determine and apply a set of test vectors for isolated asynchronous regions of the design in a full-timing gate-level simulation while allowing static timing verification to operate on the synchronous regions of the design. The present invention provides this advantageous functionality.

Accordingly, it is desired to provide a method and system for verifying timing and functionality of IC designs that include synchronous and asynchronous regions. It is further desired to provide the above within a system that automatically determines the boundaries between the synchronous and asynchronous design regions, and that automatically determines test vectors to apply to the asynchronous regions. It is further desired to provide the above wherein static timing verification can be advantageously applied to verify synchronous regions of the IC design while full timing gate-level simulation can be applied only to those asynchronous regions of the design for timing and functionality verification. The present invention offers the above advantageous functionality while providing an automatic, computer controlled method and system for generating the required test vectors in a system for verification of the asynchronous regions of the IC design. These and other advantages of the present invention not specifically described above will become clear within discussions of the present invention herein.

SUMMARY OF THE INVENTION

A method and apparatus are described for verifying an integrated circuit design composed of both synchronous and asynchronous regions. The computer implemented system imports an IC design combining synchronous and asynchronous regions and utilizes a static timing analyzer to automatically determine the boundaries of the asynchronous regions including probe points at the inputs and outputs of the asynchronous regions. The static timing analyzer also generates a netlist of the asynchronous regions as well as certain information indicative of the signal arrival times of data sensed over the input probe points of the asynchronous regions. A functional simulator then uses test vectors generated for the primary inputs of the integrated circuit design and automatically determines a set of test vectors specifically for the asynchronous region by monitoring the input probe points. This can be done for each asynchronous region. The functional simulator also automatically determines a set of expected output data from the asynchronous test vectors by monitoring the output probe points. A full timing gate-level simulator then processes only the asynchronous regions using the generated test vectors, the asynchronous netlist, and the generated signal arrival times as input and generates a report. The resultant timing and functional characteristics embodied in this report ., are then compared against the expected output to complete the verification process.

Specifically, embodiments of the present invention include a computer controlled method for verifying an integrated circuit design, the method including the computer implemented steps of: receiving an integrated circuit design having synchronous and asynchronous regions; analyzing the integrated circuit design using a static timing analyzer to automatically generate design descriptions of the asynchronous regions, a list of probe points indicating input and output ports of the asynchronous regions, and a set of signal arrival times associated with each input port; simulating a response of the integrated circuit design to a first set of test vectors applied to primary inputs of the integrated circuit design using a functional simulator, wherein the functional simulator automatically generates a set of asynchronous test vectors and a set of expected results from the asynchronous regions; simulating a response of the asynchronous regions to the set of asynchronous test vectors and the set of arrival times applied to the design description of the asynchronous regions using a full-timing gate-level simulator, and generating a set of full timing results therefrom; and verifying the set of full timing results against the set of expected results.

Embodiments of the present invention include the above wherein the step of simulating a response of the integrated circuit design to a first set of test vectors applied to the integrated circuit design using a functional simulator further comprises the steps of: determining the set of asynchronous test vectors by monitoring input signals at probe points corresponding to input ports of the asynchronous region upon application of the first set of test vectors; and determining the set of expected results by monitoring output signals at probe points corresponding to output ports of the asynchronous region. Embodiments of the present invention also include a system implemented in accordance with the above.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

NOMENCLATURE

Some regions of the detailed descriptions which follow are presented in terms of a simulator, an analyzer, procedures, logic blocks, processing, and other symbolic representations of operations on data bits within a computer memory. These descriptions and representations are the means used by those skilled in the data processing arts to most effectively convey the substance of their work to others skilled in the art. A procedure, logic block, process, simulator, analyzer, etc., is here, and generally, conceived to be a self-consistent sequence of computer implemented steps leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "simulator" or "analyzer" or "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

COMPUTER SYSTEM

Figure 5:
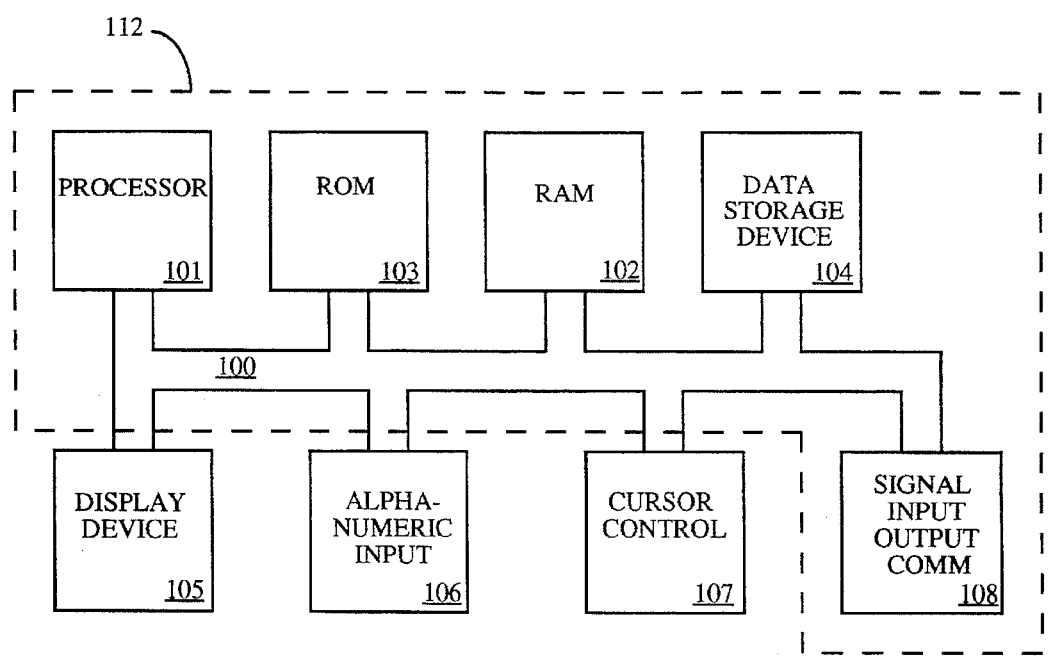
FIG. 5 illustrates a computer system of the present invention for implementing procedures, logic blocks, processing, etc., of the present invention.

Refer to FIG. 5 which illustrates a computer system 112 that can be used in accordance with the present invention. In general, computer systems 112 used by the preferred embodiment of the present invention utilize a bus 100 for communicating information, a central processor 101 coupled with the bus for processing information and instructions, a random access memory 102 coupled with the bus 100 for storing information and instructions for the central processor 101, a read only memory 103 coupled with the bus 100 for storing static information and instructions for the processor 101, a data storage device 104 such as a magnetic or optical disk and disk drive coupled with the bus 100 for storing information and instructions, a display device 105 coupled to the bus 100 for displaying information to the computer user, an alphanumeric input device 106 including alphanumeric and function keys coupled to the bus 100 for communicating information and command selections to the central processor 101, a cursor control device 107 coupled to the bus for communicating user input information and command selections to the central processor 101, and a signal generating device 108 coupled to the bus 100 for communicating command selections to the processor 101.

The display device 105 of FIG. 5 utilized with the computer system 112 of the present invention can be a liquid crystal device, cathode ray tube, or other display device suitable for creating graphic images and alphanumeric characters recognizable to the user. The cursor control device 107 allows the computer user to dynamically signal the two dimensional movement of a visible symbol (pointer) on a display screen of the display device 105. Many implementations of the cursor control device are known in the art including a trackball, mouse, joystick or special keys on the alphanumeric input device 105 capable of signaling movement of a given direction or manner of displacement. It is to be appreciated that the cursor means 107 also may be directed and/or activated via input from the keyboard using special keys and key sequence commands. Alternatively, the cursor may be directed and/or activated via input from a number of specially adapted cursor directing devices.

DESIGN VERIFICATION

Figure 1:
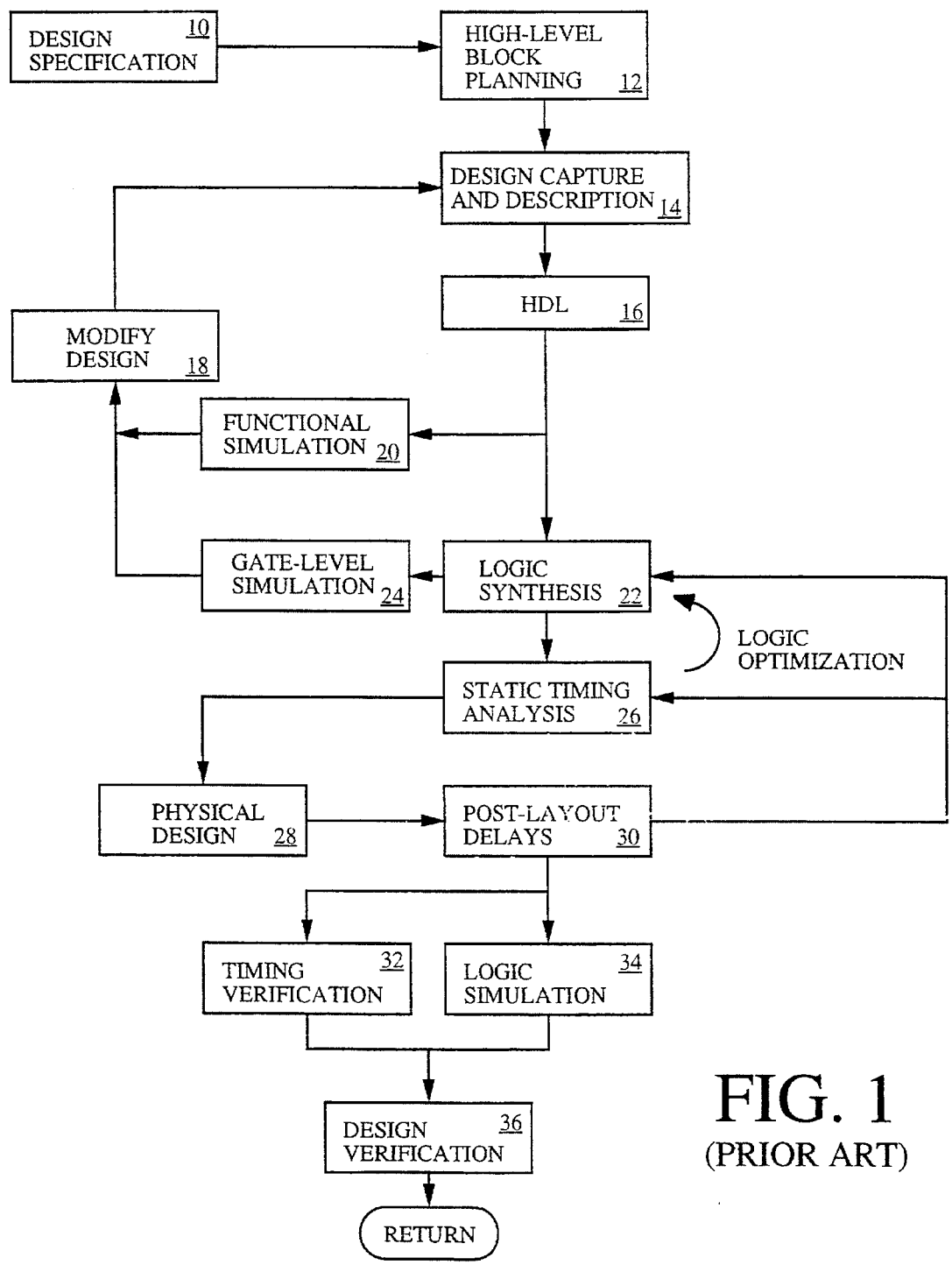
FIG. 1 is a prior art high level flow diagram illustrating steps performed to design, capture, verify and implement an integrated circuit design.
Figure 2:
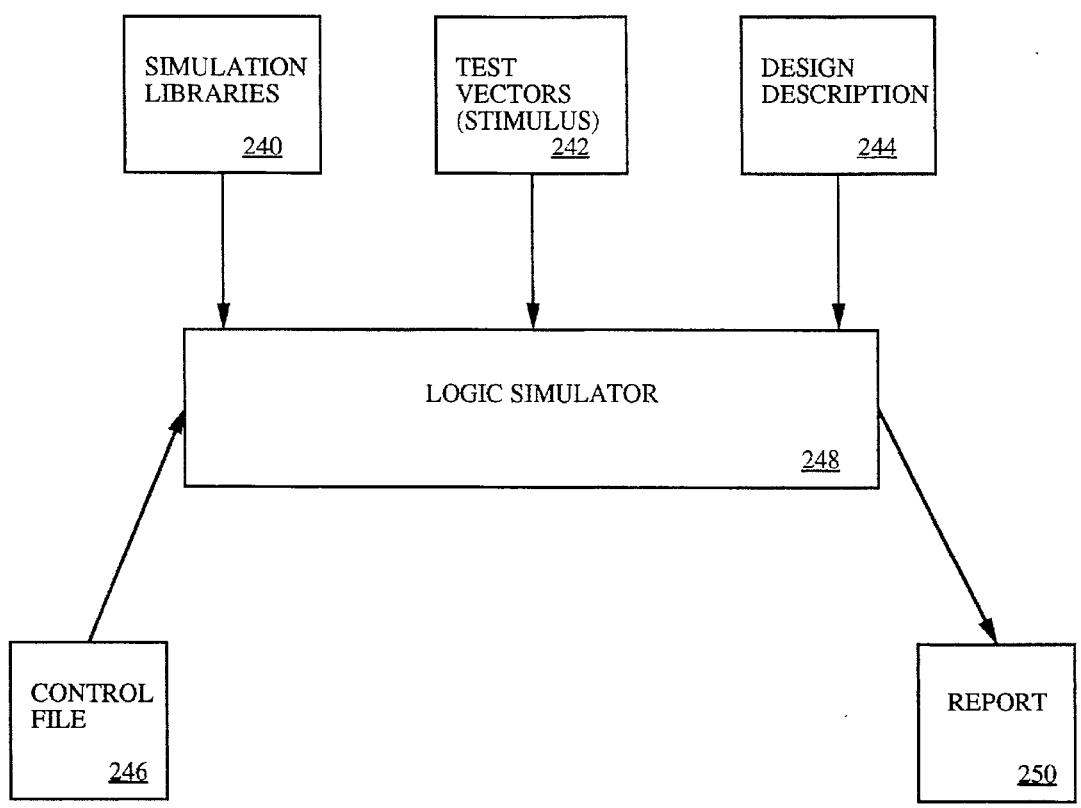
FIG. 2 is a prior art flow diagram illustrating the use of a gate-level logic simulator to verify functionality and timing behavior of an integrated circuit design.
Figure 3:
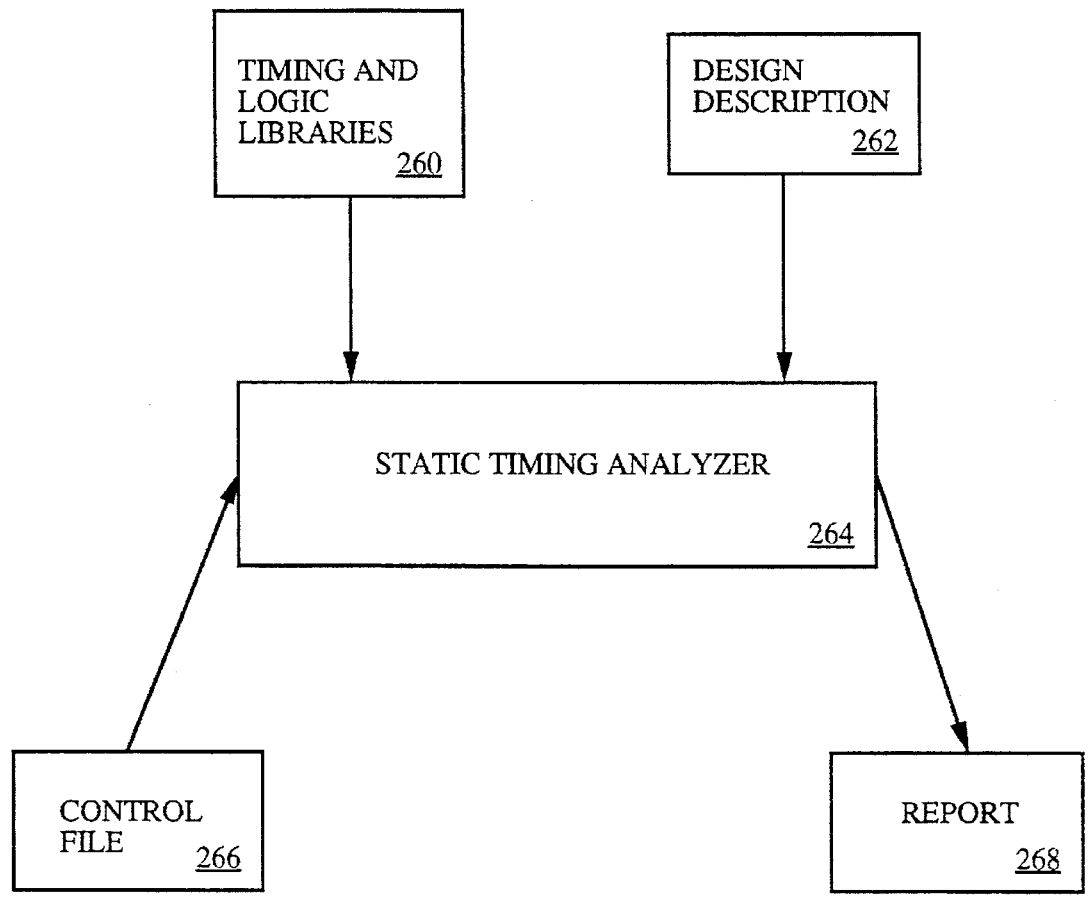
FIG. 3 is a prior art flow diagram illustrating the use of a static timing analyzer to verifying timing behavior of a synchronous region of a circuit design.
Figure 4A:
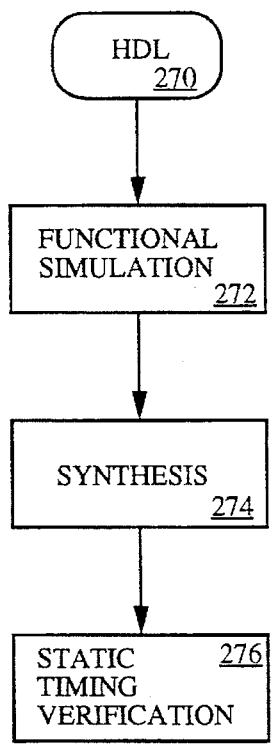
FIG. 4A is a flow diagram illustrating steps to perform verification of synchronous integrated circuit designs.
Figure 4B:
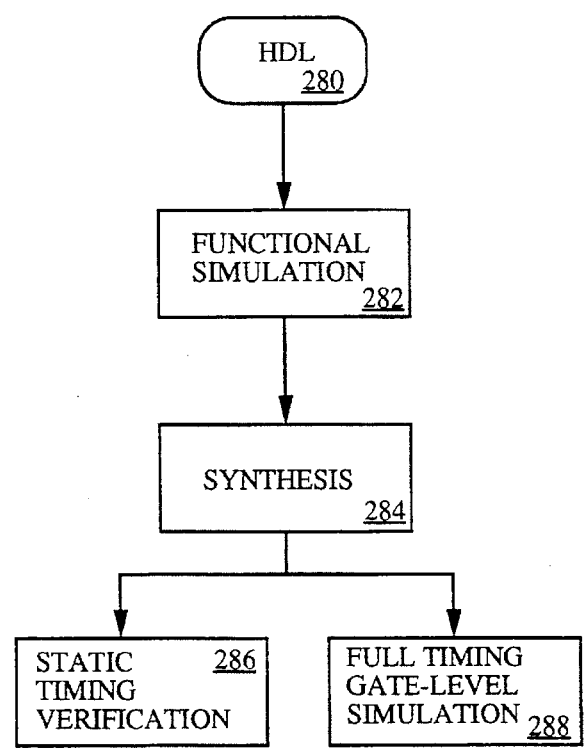
FIG. 4B is a flow diagram illustrating steps to perform verification of functionality and timing behavior of asynchronous integrated circuit designs.

In accordance with the present invention, a static timing analyzer and a functional simulator assist in automating the timing verification of asynchronous logic by: (1) isolating asynchronous logic into blocks that can be simulated separately; (2) providing probe points in the asynchronous logic for simulation; and (3) using generated asynchronous test vectors from a high-level functional simulation to perform verification. In this fashion, the present invention allows automated verification of IC designs having both synchronous and asynchronous regions. Although FIG. 1 illustrates a simulation based process, the present invention verification processes are equally applicable to synthesis based and non synthesis based processes.

Figure 6:
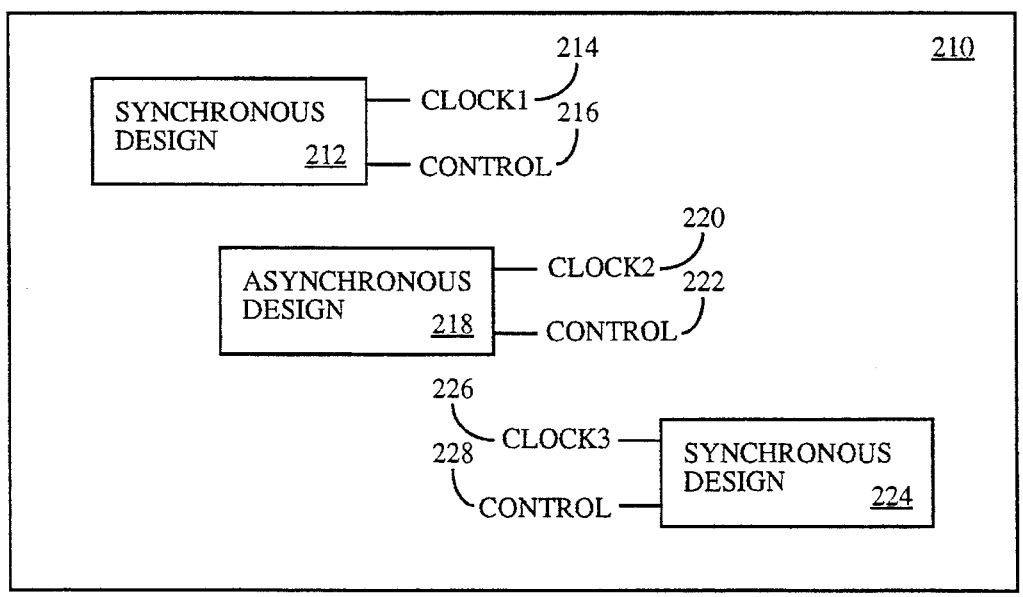
FIG. 6 illustrates an exemplary integrated circuit design combining synchronous and asynchronous designs that can be input to processing of the present invention.

FIG. 6 illustrates an exemplary IC design 210 that contains both synchronous and asynchronous regions. This design 210 is exemplary in that the present invention can process an IC design with one or more asynchronous regions with one or more synchronous regions. A first synchronous design 212 has a first clock 214 and a control 216 line. The controls signals 216 are synchronized to the clock 214. A second synchronous design 224 has a third clock 214 and a control line 228. The controls signals 228 are synchronized to the clock 226. Designs 224 and 212 are synchronous because their clock signals 214, 226 share a common base period.

Design 210 also contains an asynchronous design region 218 that receives a second clock 220 and control signals 222. Control signals 222 may not be synchronized to any clock. Clock 220 and clock 214 are asynchronous because they do not share a common base period, or the common base period shared is unrealistically long. Likewise, clock 220 and clock 226 are asynchronous because they do not share a common base period, or the common base period shared in unrealistically long. In general, asynchronous paths can involve: (1) combinatorial logic loops (which are broken by the timing analyzer); (2) asynchronous primary inputs which are not constrained (e.g., referenced) to a clock; (3) asynchronous set/reset or control logic; and/or (4) state-device to state-device paths involving asynchronous clocks.

The present invention provides a method and system for processing an IC design that contains both synchronous and asynchronous regions (e.g., design 210). Although the static timing analyzer cannot inherently verify asynchronous logic, it can be used to effectively assist in verifying and isolating asynchronous logic into regions that can be simulated. Further, the static timing analyzer can be used to work with a functional simulator to generate a set of test vectors to apply to the asynchronous regions.

Figure 7A:
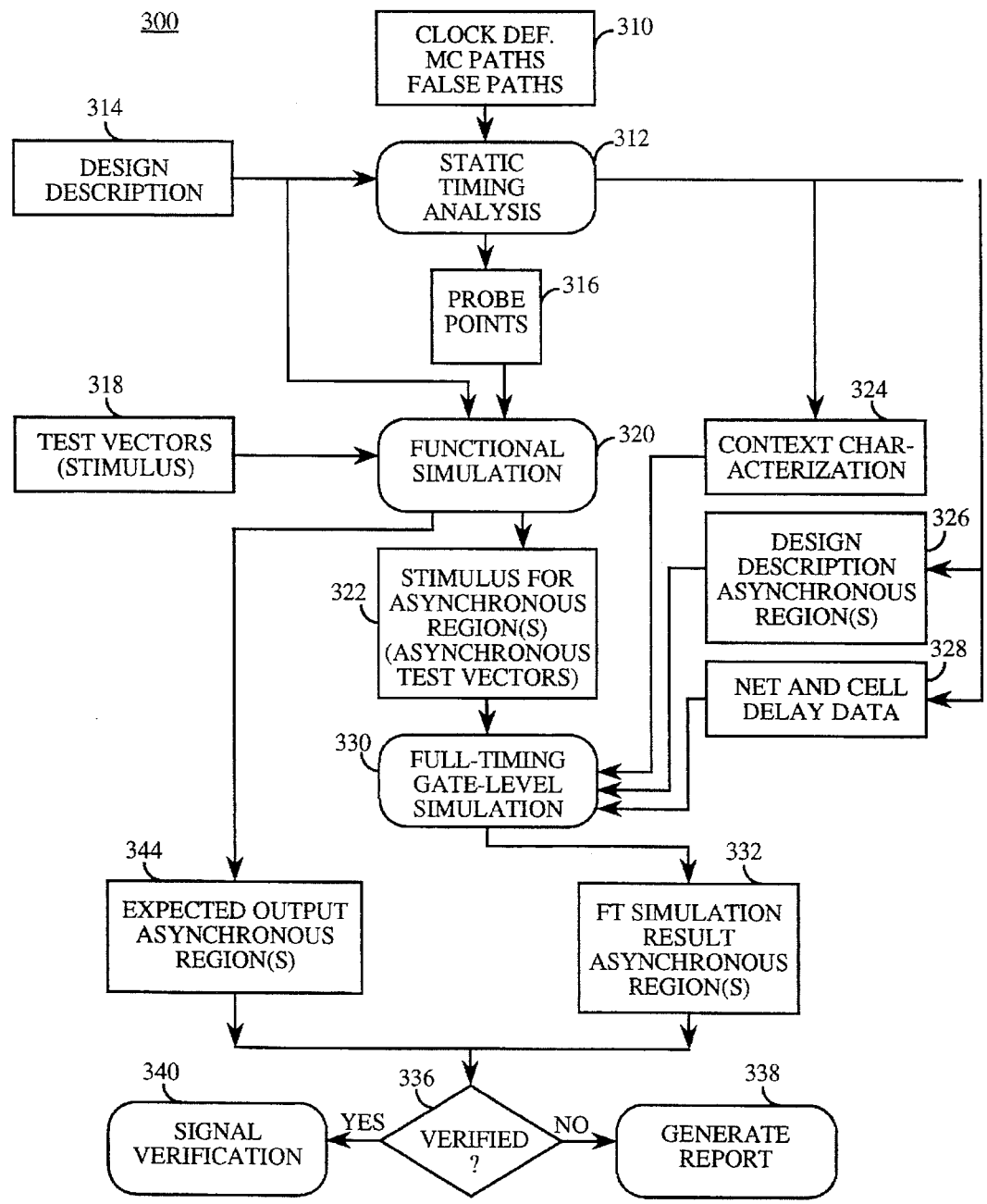
FIG. 7A illustrates a flow diagram of the verification process of the present invention for an integrated circuit design having both synchronous and asynchronous regions.

FIG. 7A illustrates a flow diagram of the verification process 300 of an embodiment of the present invention. The timing verification of an IC design with one or more asynchronous regions involves verification of the synchronous regions through static timing and verification of asynchronous regions through gate-level timing simulation. A brief discussion of the design description 314, the static and timing analysis logic block 312, the functional simulation logic block 320, and the full-timing gate-level simulation logic block 330 is presented below followed by a more detailed description of flow 300. It is appreciated that these logic blocks are implemented within computer system 112 (FIG. 5) by processor 101 executing instructions that are stored in memory 102, 103 or 104, or other suitable memory storage device. Also, data structures of FIG. 7A are stored in and retrieved from memory devices 102, 103 or 104, or other suitable memory storage device.

The design description 314 of FIG. 7A is a gate-level technology mapped representation (e.g., mapped netlist) of an IC design to be verified by the present invention. This is typically created through a synthesis tool, many of which are well known in the art. Some regions of the IC design can be created through schematic capture, module compilers and generators, or other well known methods. The static timing analysis logic block (STA) 312 is used by the present invention to verify each synchronous region (e.g., regions 212 and 224) of the IC design for timing behavior. With the exception of special functions described herein in accordance with the present invention, any of a number of well known static timing analysis procedures can be used within the present invention. The STA 312 analyzes the timing aspects of each synchronous region as referenced from a clock cycle and evaluates setup and hold times, propagation delays, etc., to determine timing behavior of a circuit. The STA 312 is also used by the present invention to detect start points of asynchronous paths to create or determine regions that exhibit asynchronous behavior. In accordance with the present invention, the STA 312 creates data that is used by a functional simulator 320 to automatically generate asynchronous test vectors 322 and expected outputs 344 for timing simulation of asynchronous regions of design 210.

The functional simulation (FS) logic block 320 of FIG. 7A simulates the response of the IC entire design 210 (as represented by design description 314) upon application of input test vectors to the primary inputs of the IC design. The FS block 320 generates a set of asynchronous functional test vectors 322 that are to be applied directly to the asynchronous region(s) of IC design 210. The FS block 320 utilizes probe points 316 which correspond to the input and output of various asynchronous regions of design 210, and creates stimulus at these probe points given the input functional test vectors 318. As the simulation is executed, the results at the output ports of the asynchronous region(s) are also recorded by FS block 320 and stored as expected results 344.

With the exception of special functions as described herein in accordance with the present invention, any of a number of well known procedures can be used as the FS block 320 of the present invention. Within one embodiment of the present invention, the product, TestBranch Manager, available from Synopsys, Inc. of Mountain View, Calif. can be used to generate the test vectors given a set of probe points. TestBranch Manager is an off-the-shelf option for Synopsys' VHDL System Simulator (TM).

The full-timing dynamic gate-level simulation (FTGL) block 330 of FIG. 7A is executed only for the asynchronous regions of IC design 210 as defined and detected by the STA block 312. The set of asynchronous test vectors 322 used by FTGL block 330 are generated by the FS block 320. With the exception of special functions as described herein in accordance with the present invention, any of a number of well known procedures can be used as the FTGL block 330 of the present invention.

The verification flow 300 of FIG. 7A is now described in more detail. In discussing the flow diagram of FIG. 7A, reference is also made to FIG. 7B, FIG. 7C, FIG. 8A, FIG. 8B and FIG. 9. A design description 314 of an exemplary IC design 210 is input to the STA 312 at block 314. This design description 314 can be in HDL, e.g., Verilog or VHDL. An external file 310 is also input to the STA 312 and provides some additional operational data that is not included in the design description file 314. The external file 310 includes the definitions of the clock wave-forms, descriptions of multicycle paths (if any), descriptions of false paths, clock skews, etc., as well as other well known items, for different regions of IC design 210.

Figure 7B:
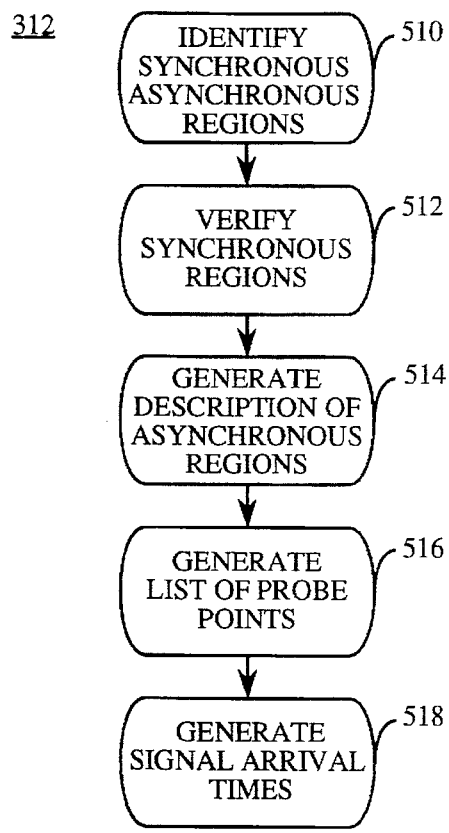
FIG. 7B is a flow diagram of process steps of the static timing analysis procedure of the present invention.
Figure 9:
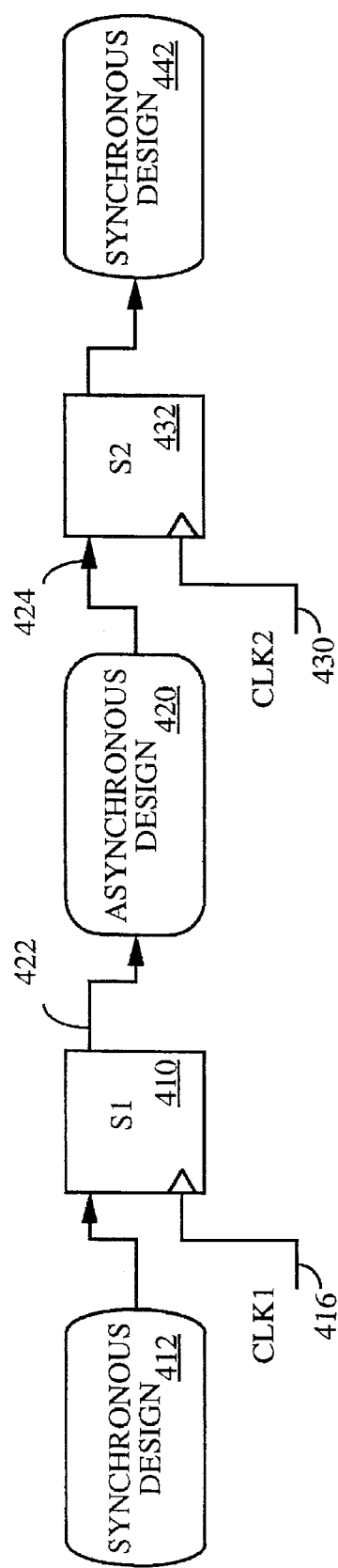
FIG. 9 illustrates a block diagram of a circuit model utilized by the present invention to determine boundaries between synchronous and asynchronous regions of an integrated circuit design.

In accordance with the above, FIG. 7B illustrates the more pertinent processes of STA 312 in more detail. At block 510, the STA 312 examines the design description 314 to automatically determine the boundaries of the synchronous and asynchronous regions of exemplary IC design 210. FIG. 9 illustrates an exemplary boundary determination performed by the present invention. As shown, the launching state device 410 clock (416) is different from the capturing state device 432 clock (430). Clock 416 and clock 430 do not share a common clock period, or the base period is unreasonably long. As such, these clocks are determined to be asynchronous by the STA 312. The section of logic that is asynchronous (e.g., section 420) is isolated into regions by the present invention with the ports of the regions (e.g., port 422 and port 424) representing the boundaries of the logic. The present invention associates all logic with the asynchronous section 420 that can be traced back to the launching state device 412. Thus, signal arrival times of all primary inputs to the region are synchronized to one or more clocks. The process 510 (FIG. 7B) is performed by the present invention to discover the boundaries of all synchronous and asynchronous regions of IC design 210.

Although a number of identification procedures can be used within the present invention, the following exemplary procedure can be used for asynchronous region detection as performed by block 510 of FIG. 7B:

```
for each cell1 triggered by a clock signal CLK1
    identify each path starting from cell1
        identify cell2 where path ends
            identify CLK2 as the clock which triggers cell2
                if clocks CLK1 and CLK2 do not share common
                    base period then path is part of an
                    asynchronous region
                endif
endfor
```

According to the above, after all the paths which form the asynchronous regions are identified, the regions can be specified in the form of: (1) all start and end points of the asynchronous paths (this forms the boundary of the asynchronous regions) and (2) a list of all the logic cells which are traversed by the asynchronous paths.

At logic block 512 of FIG. 7B, the STA 312 verifies the timing behavior of each synchronous region of design description 318 (e.g., exemplary region 212 and region 224) and stores the results of this verification in memory 102 or 104 (see FIG. 5). Any number of well known static timing analysis procedures can be used to verify the synchronous regions of design 210 at block 512. To verify the timing of the synchronous regions, the asynchronous paths are disabled by the present invention so that only synchronous timing violations are reported by block 512. This is achieved by marking the asynchronous paths as false and/or declaring the asynchronous clock signals are constants. If an error in the verification process is encountered, the present invention will flow to block 338 (FIG. 7A) where an error report is generated.

Figure 8A:
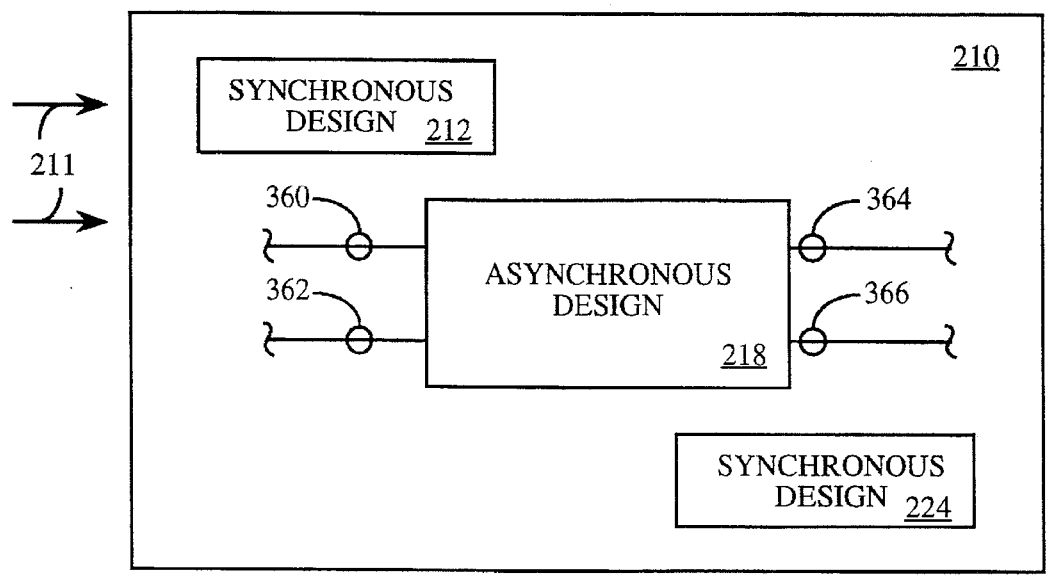
FIG. 8A illustrates an exemplary integrated circuit design of the present invention with both synchronous and asynchronous regions and illustrates input and output probe points to the asynchronous region.

At logic block 514, the STA 312 of the present invention generates a gate level design description 326 for each asynchronous region of design 210 based on the synchronous-asynchronous boundary information determined in block 510. Each asynchronous region (e.g., region 420) is therefore identified and a design description for each region is generated at block 514. At logic block 516, the present invention STA 312 utilizes the defined synchronous-asynchronous boundaries to determine the input and output ports of the asynchronous regions and identifies these as probe points for each asynchronous region. A probe point is a label that uniquely identifies an internal node in the design description 314. FIG. 8A illustrates exemplary design 210 and as shown the asynchronous design 218 is isolated and a design description is generated by the present invention for asynchronous design 218 and placed into data 326. Input probe points 360 and 362 and output probe points 364 and 366 are determined by the present invention using the above defined synchronous-asynchronous boundaries. At block 516 (FIG. 7B), a list of all input and output probe points for asynchronous regions is determined and stored in memory in data 316. Primary inputs 211 to design 210 are also shown (FIG. 8A).

Figure 8B:
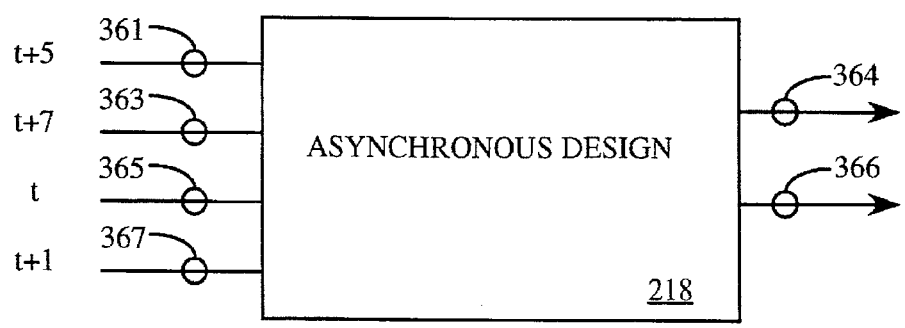
FIG. 8B illustrates inputs to an asynchronous region of an integrated circuit design of the present invention and also illustrates signal arrival times associated with each input.

At block 518 of FIG. 7B, the STA 312 of the present invention utilizes the static timing analysis and the input probe points 316 to determine signal arrival times for each input of the probe points. These arrival times represent the signal delay from the originating synchronous design to the probe inputs of the asynchronous region 218. The signal arrival times are referenced from the input probe point with the smallest signal arrival time. FIG. 8B illustrates some exemplary signal arrival times in more detail. As shown, there are four exemplary input probe points, 361, 363, 365, and 367 which correspond to asynchronous design 218. The present invention at block 518 utilizes well known procedures to determine the arrival times for these signals. Exemplary arrival times are listed as t+5 for probe point 361, t+7 for probe point 363, t for probe point 365 (the smallest arrival time), and t+1 for probe point 367. The processing 312 is performed for each synchronous and asynchronous region.

FIG. 7A illustrates the outputs generated by STA logic block 312. The list input and output probe points (for each asynchronous region) are stored in block 316. The arrival times for each of the input probe points are stored in the context characterization block 324. Context characterization block 324 also includes pertinent clock definition and clock skew information generated by STA block 312 and related to each asynchronous region. After the asynchronous regions are identified, they are characterized in order to represent the design context of each region. The characterization of a region consists of specifying external delays relative to the boundaries of the region. This consists of: (1) input delays to each input port of the asynchronous region relative to each clock; (2) drive strength/slew for each input port of the asynchronous region; (3) external load values of each input port of the asynchronous region; (4) output delays of each output port of the asynchronous region relative to each clock; (5) output load values of each output port of the asynchronous region; and (6) clocks skew of all clock signals.

The design description of each asynchronous region is stored in block 326. The design description for each asynchronous region can be a netlist and can contain formatted timing information. The STA block 312 of the present invention can also generate an optional net and cell delay data structure 328. This optional data set can be used for more accurate timing simulations and contains all cell and net delay information for each asynchronous region. As shown, data blocks 324, 326 and 328 interface with the full timing gate level (FTGL) simulator 330. The probe points 316 are output to the functional simulation (FS) block 320.

Figure 7C:
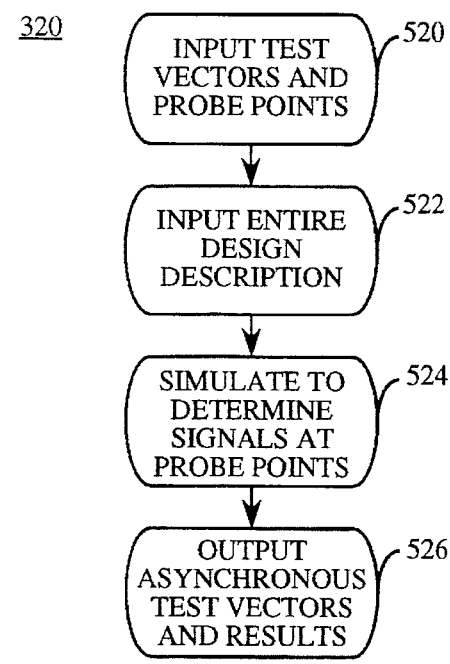
FIG. 7C is a flow diagram of the functional simulator of the present invention.

Processes of the FS block 320 are shown in more detail in FIG. 7C. At block 520 test vectors 318 (FIG. 7A) are input as well as the list of input and output probe points 316 to each asynchronous region. The test vectors 318 are generated by earlier processes of the design cycle and apply to the entire IC design 210 and are to be applied at the primary inputs 211 of IC design 210 (see FIG. 8A). There are well known procedures to generate these test vectors, such as automatic test pattern generation (ATPG) procedures, and any of these procedures are suitable within the present invention. The input probe points 316 identify the input and output ports of each asynchronous design. At block 522, the FS block 320 access the entire design description 314 for design 210. Alternatively, a certain logical hierarchy that fully embeds an asynchronous design can also be input at 522.

At block 524 of FIG. 7C, the FS block 320 simulates the response of the design description 314 of design 210 to the application of the input test vectors 318 to the primary inputs 211 of IC design 210 to determine the value of signals that arrive at the input probe points (e.g., 361, 363, 365, and 367) and at the output probe points (e.g., 364 and 366). The functional simulator 320 can be preferably a cycle based simulator or can be a unit based simulator. Specifically, the functional simulator 320 uses the list of probe points 316 created by the STA 312 to detect and record changes in the logical values at these internal nodes of the design when the input test vectors 318 are applied at the primary inputs 211. This is performed while the simulation is running. Timing characteristics are not considered at this point.

Referring to FIG. 8A and FIG. 8B, during a simulation the FS block 320 performs functional simulation and monitors the values input over the probe points 361, 363, 365, and 367 as the input test vectors 318 are applied at primary inputs 211 of the design description 314. The changes of logical values at the input probe points (e.g., that are input to the asynchronous regions) are recorded and used as stimulus or test vectors for a detailed timing analysis that is performed further below. The values recorded over the input probe points (e.g., 361, 363, 365, 367) are called the asynchronous test vectors or "asynchronous region stimulus." The values or signal changes recorded over the output probe points (e.g., 364, 366) are called the expected asynchronous output 344 and are the expected result due to application of the asynchronous test vectors 322.

At block 526, the FS block 320 of the present invention stores the asynchronous test vectors in block 322 (FIG. 7A) and also stores the expected asynchronous output in block 344 (FIG. 7A). This information is stored in memory.

Refer to FIG. 7A. The timing of each asynchronous region of design 210 is verified through full-timing dynamic gate-level (FTGL) simulation 330. Block 330 inputs the context characterization data 324 which includes the signal arrival times for each input for each asynchronous region of design 210. Also input is the detailed gate-level description 326 of each asynchronous design. Optionally, block 330 can input an external file 328 that contains net and cell delay data for each cell of the description in block 326. Lastly, input to FTGL simulation block 330 are the asynchronous test vectors 322 for each asynchronous region defined in block 326. The signal arrival times within 324 and the asynchronous design descriptions within 326 are automatically generated by the STA 312 of the present invention. Further, the asynchronous test vectors 322 are automatically generated by the FS block 320 of the present invention.

With this information, the FTGL simulator 330 of the present invention performs a full-timing gate-level simulation of only the asynchronous regions of design 210. A number of well known procedures exists that perform FTGL simulation and any of these can be used within the scope of the present invention given the inputs provided by the present invention. Specifically, the FTGL simulator 330 simulates the response of each asynchronous region (e.g., 218) to the application of the asynchronous test vectors 322 with the specified signal arrival times 324. This is performed for each asynchronous region in netlist 326. The result of the FTGL simulation is stored in block 332.

Refer to FIG. 8B. The FTGL simulator 330 applies the asynchronous test vectors 322 to the asynchronous design 218 at the probe points (e.g., 361, 363, 365, and 367). The asynchronous test vectors 322 are applied with the proper arrival times (e.g., t+5, t+7, t, and t+1) for each input probe point. Block 330 of FIG. 7A then performs a full-timing gate-level simulation which generates a set of full timing gate level simulation results 332. The simulation results 332 correspond to the output generated over the output probe points (e.g., 364 and 366) in response to the full-timing gate-level simulation. This is done for each asynchronous region.

The FT simulation results 332 are based on a full timing gate level simulation and therefore take into consideration both the timing and functionality behavior of each asynchronous design. Block 336 the compares the results 332 with the expected asynchronous output results in block 344. This is done for each asynchronous region in design 210. If the results in block 344 match the results in block 332, then block 336 signals that a proper verification has been performed. If not, then an error report is generated at block 338. Using the above procedure 300, the entire design 210 can be verified by the present invention for timing correctness.

It is appreciated that the present invention STA block 312 performs the timing analysis in the synchronous design regions and the functionality of the synchronous designs can be tested (e.g., with a functional simulation) before or after synthesis in accordance with embodiments of the present invention. As discussed above, the process 300 of FIG. 7A can be applied to each asynchronous region of design 210.

The present invention advantageously utilizes the STA logic 312 to isolate an asynchronous design region and to automatically provide probe points and signal arrival times for each asynchronous region as well as a design description for each region. Further, FS 320 is utilized by the present invention to automatically compute asynchronous test vectors and expected results in response thereto. All of this information is then used by the FTGL simulator 330 to perform a simulation to verify the timing and functionality of the asynchronous region. Since the entire flow is computer implemented and automatic, this significantly decreases the time required to perform verification for a design that has both synchronous and asynchronous regions.

In accordance with the present invention, another advantage to using STA logic 312 is to provide the context information 324 for each asynchronous region. This allows simulation of each region in isolation while still yielding accurate results. The present invention also utilizes an automatic procedure by which effective and thorough test patterns can be automatically determined for and applied to the asynchronous regions.

The preferred embodiment of the present invention, a method and system for verifying integrated circuit designs that have synchronous and asynchronous regions, is thus described. While the present invention has been described in particular embodiments, it should be appreciated that the present invention should not be construed as limited by such embodiments, but rather construed according to the below claims.

What is claimed is:

1. A computer controlled method for verifying an integrated circuit design, said method comprising the computer implemented steps of:

receiving an integrated circuit design having a synchronous region and an asynchronous region;

analyzing said integrated circuit design using a static timing analyzer to automatically generate a design description of said asynchronous region, a list of probe points indicating input and output ports of said asynchronous region and a set of arrival times associated with each input port;

simulating a response of said integrated circuit design to a first set of test vectors applied to said integrated circuit design using a functional simulator, wherein said functional simulator automatically generates a set of asynchronous test vectors and a set of expected results from said asynchronous region;

simulating a response of said asynchronous region to said set of asynchronous test vectors and said set of arrival times applied to said design description of said asynchronous region using a full-timing gate-level simulator and generating a set of full timing results therefrom; and verifying said set of full timing results against said set of expected results.

2. A method as described in claim 1 wherein said step of simulating a response of said integrated circuit design to a first set of test vectors applied to said integrated circuit design using a functional simulator further comprises the steps of:

determining said set of asynchronous test vectors by monitoring input signals at probe points corresponding to input ports of said asynchronous region upon application of said first set of test vectors; and determining said set of expected results by monitoring output signals at probe points corresponding to output ports of said asynchronous region.

3. A method as described in claim 1 wherein said step of analyzing said integrated circuit design using a static timing analyzer further comprises the step of verifying said synchronous region of said integrated circuit design using said static timing analyzer.

4. A method as described in claim 1 wherein said step of analyzing said integrated circuit design using a static timing analyzer further comprises the steps of:

determining said design description of said asynchronous region by identifying portions of said integrated circuit design that use reference clocks that do not share a common base period; and defining said asynchronous region by absorbing into said asynchronous region all logic that can be traced back to one of said portions.

5. A method as described in claim 1 wherein said step of analyzing said integrated circuit design using a static timing analyzer also produces an external file containing net and cell delay data for each cell of said asynchronous region and wherein said step of simulating a response of said asynchronous region to said set of asynchronous test vectors and said set of arrival times applied to said design description of said asynchronous region utilizes said external file for simulation.

6. A method as described in claim 1 wherein said step of simulating a response of said integrated circuit design to a first set of test vectors applied to said integrated circuit design using a functional simulator comprises the step of applying said first set of test vectors to primary inputs of said integrated circuit design.

7. A method as described in claim 1 wherein said functional simulator is a cycle based functional simulator.

8. In a computer system having a processor coupled to a bus and a memory device coupled to said bus, a computer implemented method for verifying timing behavior of an integrated circuit design having a synchronous region and an asynchronous region, said method comprising the computer implemented steps of:

analyzing said integrated circuit design using a static timing analyzer to automatically generate a design description of said asynchronous region, a list of probe points indicating input and output ports of said asynchronous region and a set of signal arrival times associated with each input port of said asynchronous region;

simulating a response of said integrated circuit design to a first set of test vectors applied to primary inputs of said integrated circuit design using a functional simulator to automatically generate a set of asynchronous test vectors and a set of expected results;

simulating a response of said design description of said asynchronous region to said set of asynchronous test vectors with said set of signal arrival times applied at said input ports of said design description of said asynchronous region using a full-timing gate-level simulator and generating a set of full timing results therefrom; and verifying said set of full timing results against said set of expected results.

9. A method as described in claim 8 wherein said step of simulating a response of said integrated circuit design to a first set of test vectors further comprises the steps of:

determining said set of asynchronous test vectors by monitoring input signals at probe points corresponding to said input ports of said asynchronous region upon application of said first set of test vectors; and determining said set of expected results by monitoring output signals at probe points corresponding to said output ports of said asynchronous region.

10. A method as described in claim 8 wherein said step of analyzing said integrated circuit design using a static timing analyzer further comprises the step of verifying said synchronous region of said integrated circuit design using said static timing analyzer.

11. A method as described in claim 8 wherein said step of analyzing said integrated circuit design using a static timing analyzer further comprises the steps of:

determining said design description of said asynchronous region by identifying portions of said integrated circuit design that use reference clocks that do not share a common base period; and defining said asynchronous region by absorbing into said asynchronous region all logic that can be traced back to one of said portions.

12. A method as described in claim 11 wherein said step of analyzing said integrated circuit design using a static timing analyzer further comprises the step of determining said probe points by identifying input and output ports of said design description of said asynchronous region.

13. A method as described in claim 8 wherein said step of analyzing said integrated circuit design using a static timing analyzer further comprises the step of producing an external file containing net and cell delay data for each cell of said asynchronous region and wherein said step of simulating a response of said design description of said asynchronous region to said set of asynchronous test vectors with said set of signal arrival times applied at said input ports of said design description of said asynchronous region using a full-timing gate-level simulator utilizes said external file for simulation.

14. A method as described in claim 8 wherein said functional simulator is a cycle based functional simulator.

15. A computer system having a processor coupled to a bus, a memory device coupled to said bus and apparatus for verifying an integrated circuit design having a synchronous region and an asynchronous region, said apparatus further comprising:

a static timing analyzer for analyzing said integrated circuit design to automatically generate a design description of said asynchronous region, a list of probe points indicating input and output ports of said asynchronous region and a set of signal arrival times associated with each input port of said asynchronous region;

a functional simulator coupled to receive information from said static timing analyzer, said functional simulator for simulating a response of said integrated circuit design to a first set of test vectors applied to primary inputs of said integrated circuit design, wherein said functional simulator automatically generates a set of asynchronous test vectors for application to said asynchronous region and a set of expected results;

a full timing gate level simulator coupled to receive information from said static timing analyzer and from said functional simulator, said full timing gate level simulator for simulating a response of said design description of said asynchronous region to application of said set of asynchronous test vectors with said set of signal arrival times to said input ports of said asynchronous region, said full timing gate level simulator also for generating a set of full timing results therefrom; and verification logic for verifying said set of full timing results against said set of expected results.

16. A computer system as described in claim 15 wherein said static timing analyzer comprises:

logic for determining said set of asynchronous test vectors by monitoring input signals at probe points corresponding to said input ports of said asynchronous region upon application of said first set of test vectors; and logic for determining said set of expected results by monitoring output signals at probe points corresponding to said output ports of said asynchronous region.

17. A computer system as described in claim 15 wherein said static timing analyzer further comprises logic for verifying said synchronous region of said integrated circuit design.

18. A computer system as described in claim 15 wherein said static timing analyzer further comprises:

logic for determining said design description of said asynchronous region by identifying portions of said integrated circuit design that use reference clocks that do not share a common base period; and logic for defining said asynchronous region by absorbing into said asynchronous region all logic that can be traced back to one of said portions.

19. A computer system as described in claim 18 wherein said static timing analyzer further comprises logic for determining said probe points by identifying input and output ports of said design description of said asynchronous region.

20. A computer system as described in claim 15 wherein said functional simulator is a cycle based functional simulator.

* * * * *